United States Patent
Weng

[11] Patent Number: 5,612,886
[45] Date of Patent: Mar. 18, 1997

[54] METHOD AND SYSTEM FOR DYNAMIC DISPATCHING IN SEMICONDUCTOR MANUFACTURING PLANTS

[75] Inventor: Yi-Cherng Weng, Tainan, Taiwan

[73] Assignee: Taiwan Semiconductor Manufacturing Company Ltd., Hsin-Chu, Taiwan

[21] Appl. No.: 440,094

[22] Filed: May 12, 1995

[51] Int. Cl.[6] .............................. G06F 19/00; G06G 7/64; G06G 7/66

[52] U.S. Cl. ................ 364/468.07; 364/468.08

[58] Field of Search ................ 364/468, 401 R, 364/550, 468.01, 468.03, 468.05, 468.08, 468.07

[56] References Cited

U.S. PATENT DOCUMENTS

| | | | |
|---|---|---|---|
| 4,796,194 | 1/1989 | Atherton | 364/468 |
| 4,866,628 | 9/1989 | Natarajan | 364/468 |
| 5,099,431 | 3/1992 | Natarajan | 364/468 |
| 5,210,041 | 5/1993 | Kobayashi et al. | 437/8 |
| 5,219,765 | 6/1993 | Yoshida et al. | 437/8 |
| 5,240,866 | 8/1993 | Friedman et al. | 437/8 |
| 5,402,350 | 3/1995 | Kline | 364/468 |
| 5,444,632 | 8/1995 | Kline et al. | 364/468 |
| 5,546,326 | 8/1996 | Tai et al. | 364/552 |
| 5,559,710 | 9/1996 | Shahraray et al. | 364/468.06 |

Primary Examiner—Paul P. Gordon
Assistant Examiner—Robert J. Dolan
Attorney, Agent, or Firm—George O. Saile; Graham S. Jones, II

[57] ABSTRACT

A manufacturing control system uses computer control of work flow for automatic production line control. The process is to sort (Work in Process) WIP by priority and queue time; select high priority WIP; and sort WIP by queue time and batch with other WIP by the same recipe. Calculate a dynamic dispatching ranking except for high priority batch WIP. Select the high priority stage and batch the high priority stage by recipe based upon queue time management. Test whether the line remains loaded at capacity. If the line is below capacity, interrupt the method. If the line operates at capacity, then branch to recalculate the ranking. Then return to select the high priority stage and select the batch high priority stage by recipe based upon queue time management.

11 Claims, 6 Drawing Sheets

METHOD AND SYSTEM FOR DYNAMIC DISPATCHING IN SEMICONDUCTOR MANUFACTURING PLANTS

BACKGROUND OF THE INVENTION

1. Field of the Invention

This invention relates to processes of manufacture of integrated circuit chips and more particularly to automatic control of production in an integrated circuit manufacturing process.

2. Description of Related Art

In a Job shop factory there are basically two types of production decisions required. The first type of decision to be made pertains to dispatching. The second type of decision to be made relates to the wafer release policy. In the past, both the dispatching decision and the wafer release policy were negotiated and handled separately in different, independent factory management centers. In such a conventional factory, dispatching decisions are carried out at each and every work center in the factory. Those dispatching decisions depend upon the status of the Work In Process (WIP), since there can be problems of unpredictable events such as machine breakdown, machine delay and scrapped work product. That is to say that the status of WIP varies based upon the quantity of product to be released and the status of equipment.

There are many methods of dispatching WIP which have been used in the past. Such methods of dispatching WIP include FIFO (First In First Out,) LBFS (Last Buffer First Service,) EDD (Earliest Due Date,) SLACK (Remaining Cycle Time—Remaining Process Time.), CR (Critical Ratio,) LDD (Local Due Date,) and MQT (Maximum Queue Time,) ... and so on. All of the popular dispatching rules do not consider or include the wafer release policy being employed in the factory. Those prior art systems are based solely upon using the WIP status to dispatch work at a predicted due date based upon the pessimistic view that popular dispatching rules do not take care of WIP dispatching and wafer release to use WIP (Work In Process) management by using such popular dispatching rules.

U.S. Pat. No. 5,219,765 of Yoshida et al "Method for Manufacturing a Semiconductor Device Including Wafer Aging, Probe Inspection, and Feeding Back the Results of the Inspection to the Device Fabrication Process" describes a method for manufacturing semiconductor devices including tests from which information is fed back for fabrication process improvement.

U.S. Pat. No. 5,240,866 of Friedman et al "Method for Characterizing Failed Circuits on Semiconductor Wafers" shows a method for characterizing failed circuits on semiconductor wafers.

U.S. Pat. No. 5,210,041 of Kobayashi et al "Process for Manufacturing Semiconductor Integrated Circuit Device" shows computer control of testing/feedback in a chip manufacturing process control system.

SUMMARY OF THE INVENTION

There are three improvements obtained by using the dynamic dispatching methodology on semiconductor manufacturing plants which has the advantages as follows:

1) Combining of the release policy into the dispatching methodology.

2) Basing operation on the Kanban concept to decide stage priority, based on the Japanese Just-In-Time (JIT) production control methodology wherein a card is pulled to the front step in time and reduces the buffer WIP to "0".

3) Real time dispatching depends upon updated WIP and equipment status.

In accordance with this invention, a method is provided for operating a manufacturing control system with computer control of work flow in automatic control of a manufacturing production line by the steps comprising, sorting WIP by priority and queue time, selecting high priority WIP, sorting WIP by queue time and hatching with other WIP by the same recipe, performing DD_R stage calculation except for high priority batch WIP, selecting the high priority stage and hatching the high priority stage by recipe based upon queue time management, testing to determine whether the production line remains loaded at capacity, and if the production line is operating below capacity, then since the dispatching system is operating below capacity the method is interrupted, but if the production line remains operating at capacity, then branching to recalculate the DD_R and then returning to the step of selecting the high priority stage and select the batch high priority stage by recipe based upon queue time management, whereby automation of production control of a manufacturing process is provided by improved automation of work scheduling.

It is preferred that loading is calculated; and/or that demand is calculated.

It is also preferred that (DD_R) is calculated as follows:

$$(DD\_R) = \frac{UT - AO}{NEC\_R}.$$

where

UT=updated target,

AO=Actual Out data, and $$NEC\_R = \frac{NEG\_WIP}{EAC},$$

and

NEG_WIP=Next_Equipment Group WIP and

EAC=Equipment Availability Capacity.

Preferably, the UT ( updated target ) is calculated forming a minuend followed by subtraction of a subtrahend comprising Actual Out data therefrom yielding a remainder of NEC_R.

Preferably, UT is calculated by determining the maximum of MAX (MDT, AO+HP_WIP+S_WIP).

Preferably, $$NEC\_R = \frac{NEG\_WIP}{EAC}$$

$$NEC\_R = \frac{NEG\_WIP}{EAC}, \text{ and}$$

NEG_WIP = Next_Equipment Group WIP and

EAC = Equipment Availability Capacity.

Preferably, MDT is calculated by the equation:

MDT(k)=Min [D(k), C WIP(k)].

Preferably, UT is calculated by determining the maximum of MAX ((Min [D(k), C WIP(k)]), AO+HP_WIP+S_WIP).

Preferably, loading is calculated and/or demand is calculated.

A method of computer control of work flow in control of a manufacturing production line including the steps comprising, sorting WIP by priority and queue time, selecting high priority WIP, sorting WIP by queue time and batching with other WIP by same recipe, performing DD_R stage calculation except for high priority batch WIP, selecting the high priority stage and hatching the high priority stage by recipe based upon queue time management, testing to determine whether the production line remains loaded at capacity, and if the production line is operating below capacity, then since the dispatching system is operating below capacity the method is interrupted, but if the production line remains operating at capacity, then branching to recalculate the DD_R and then returning to the step of selecting the high priority stage and select the batch high priority stage by recipe based upon queue time management, whereby automation of production control of a manufacturing process is provided by improved automation of work scheduling.

A manufacturing control system in accordance with this invention includes computer control of work flow in automatic control of a manufacturing production line, means for sorting WIP by priority and queue time, means for selecting high priority WIP, means for sorting WIP by queue time and hatching with other WIP by same recipe, means for performing DD_R stage calculation except for high priority batch WIP, means for selecting the high priority stage and batching the high priority stage by recipe based upon queue time management, means for testing to determine whether the production line remains loaded at capacity, and if the production line is not operating at capacity, then since the dispatching system is operating below capacity the method is interrupted and if the production line remains operating at capacity, then means for branching to recalculate the DD_R and then return to the step of selecting the high priority stage and select the batch high priority stage by recipe based upon queue time management whereby automation of production control of a manufacturing process is provided by improved automation of work scheduling.

Preferably, means is included for calculating loading, and/or means for calculating demand.

Preferably, (DD_R) is calculated as follows:

$$(DD\_R) = \frac{UT - AO}{NEC\_R}.$$

Preferably, the UT (updated target) is calculated forming a minuend followed by subtraction of a subtrahend comprising Actual Out data therefrom yielding a remainder of NEC_R.

Preferably, UT is calculated by determining the maximum of MAX (MDT, AO+HP_WIP+S_WIP).

Preferably, $$NEC\_R = \frac{NEG\_WIP}{EAC}$$

Preferably, UT is calculated by determining the maximum of MAX (MDT, AO+HP_WIP+S_WIP).

Preferably, MDT is calculated by the equation:

$$MDT(k) = Min [D(k), C WIP(k)].$$

Preferably, loading is calculated and/or demand is calculated.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

1. INTRODUCTION

The dynamic dispatching method of this invention combines the PULL concept for next service equipment and the PUSH concept for updated WIP and equipment status. The concepts of PULL and PUSH are described by N. E. Larsen and L. Alting in "Criteria for Selecting a Production Control Philosophy", Production Planning and Control, (1993) Vol. 4, No. 1, pp 54–68.

Figure 1:
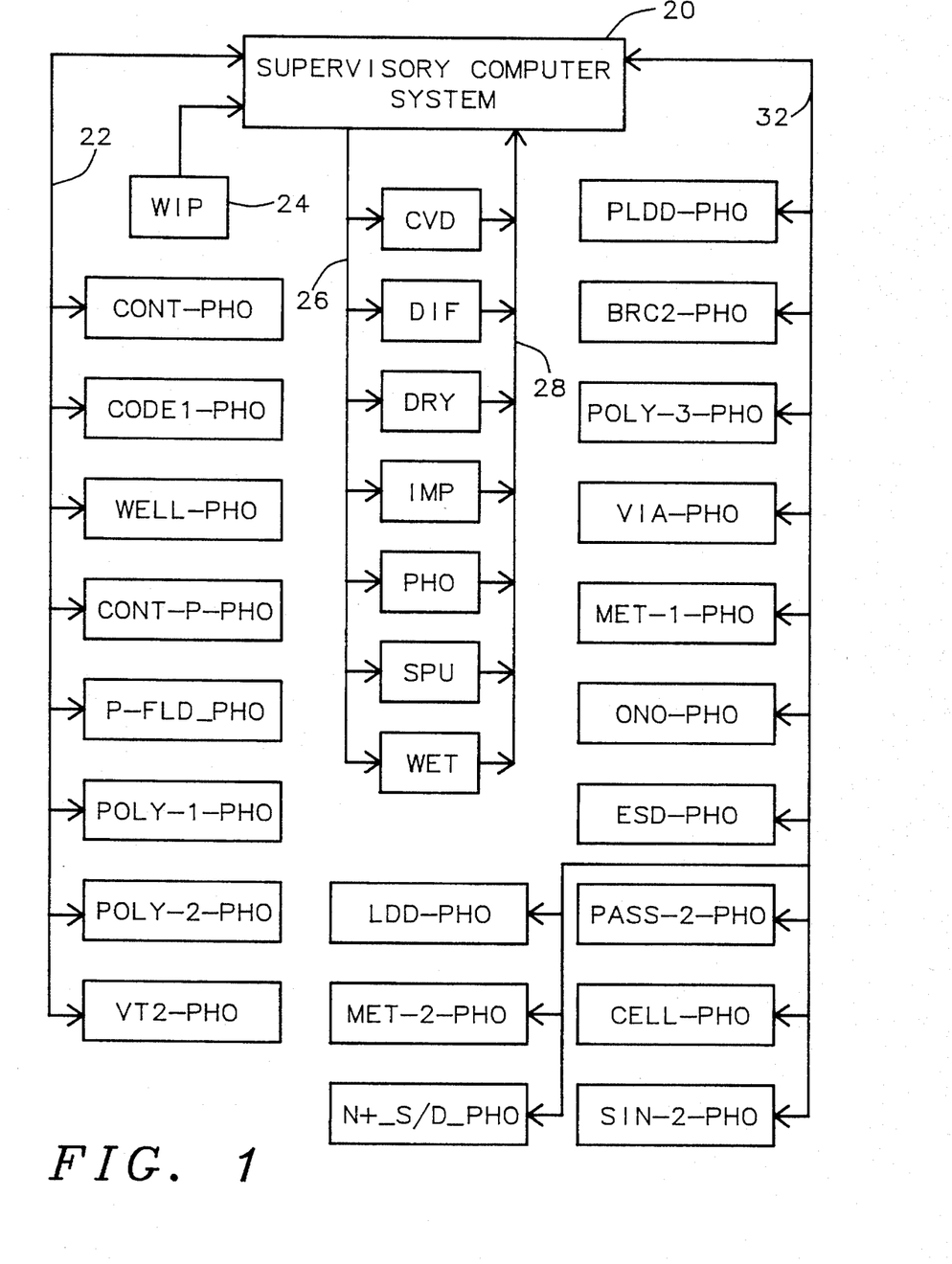
FIG. 1 shows a block diagram of a portion of a computer controlled integrated circuit manufacturing factory.

FIG. 1 shows a block diagram of a portion of a computer controlled integrated circuit manufacturing factory. The supervisor CPU 20 sends output signals on line 26 to control several work processing centers including the centers defined as follows:

CVD . . . Chemical Vapor Deposition
DIF . . . Diffusion
DRY . . . Plasma,etc.
IMP . . . Ion Implanting
PHO . . . Photolithography
SPU . . . Sputtering
WET . . . Wet Chemical Processing The above centers provide return signals on line 28 to CPU 20. There are a number of "PHO" units for photolithographic processing of a work piece which includes depositing of photoresist, exposing the photoresist with a master mask and developing the photoresist to form a mask on the surface of the workpiece.

The first group of units which are connected by bus line 22 with CPU 20 are as follows:

CONT-PHO
CODE1-PHO
WELL-PHO
CONT-P-PHO
P-FLD_PHO
1POLY-1-PHO
POLY-2-PHO
VT2-PHO

The second group of units which are connected by bus line 32 with CPU 20 which are as follows:

PLDD-PHO
BRC-2-PHO
POLY-3-PHO
VIA-PHO
MET-1-PHO
ONO-PHO
ESD-PHO
PASS-2-PHO
CELL-PHO
SIN-2-PHO
LDD-PHO
MET-2PHO
N+_S/D_PHO

2. LOADING AND DEMAND CONCEPT

Figure 2A:
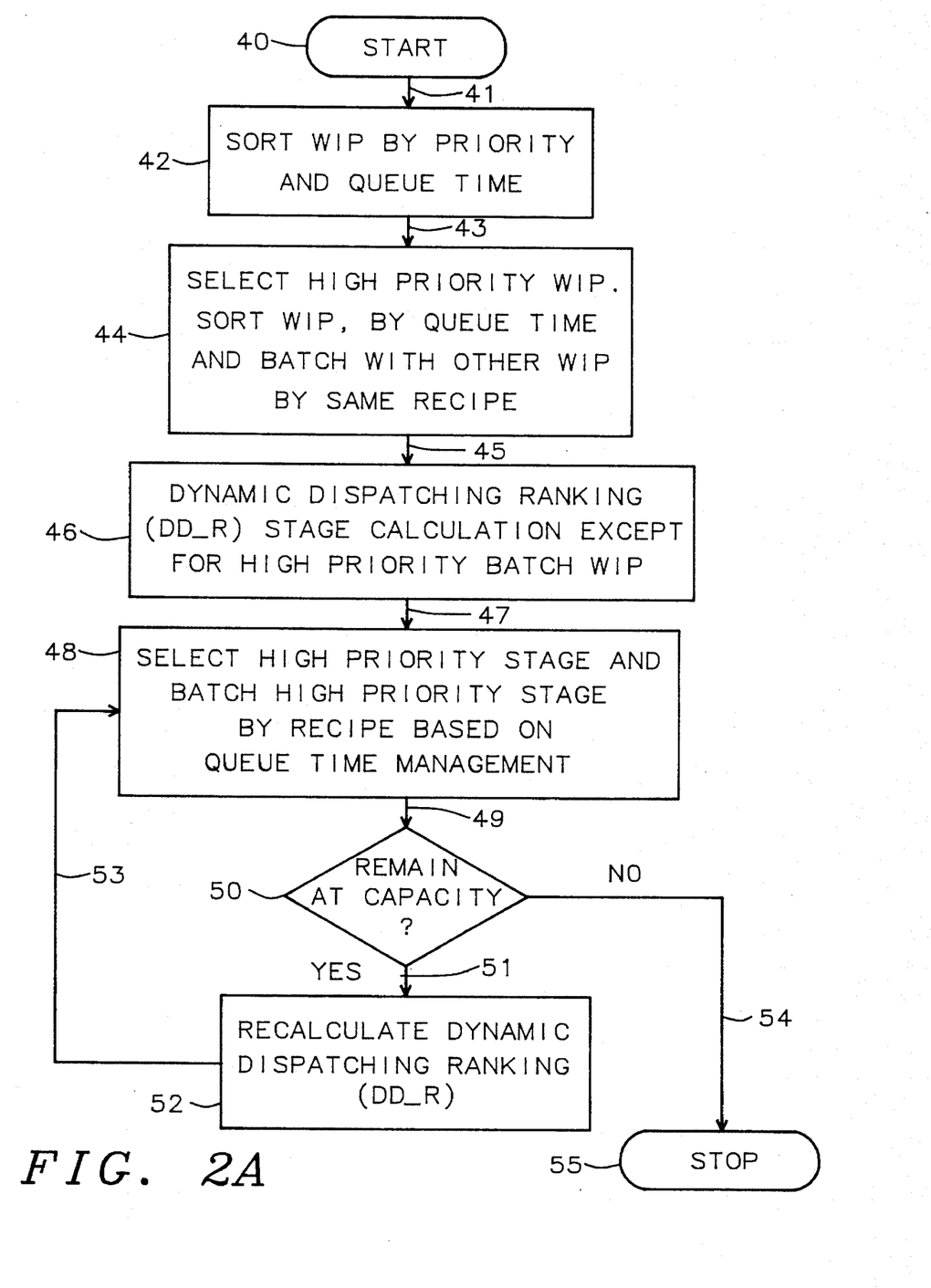
FIG. 2A shows the method (algorithm) for dispatching by lot in accordance with this invention.
Figure 2B:
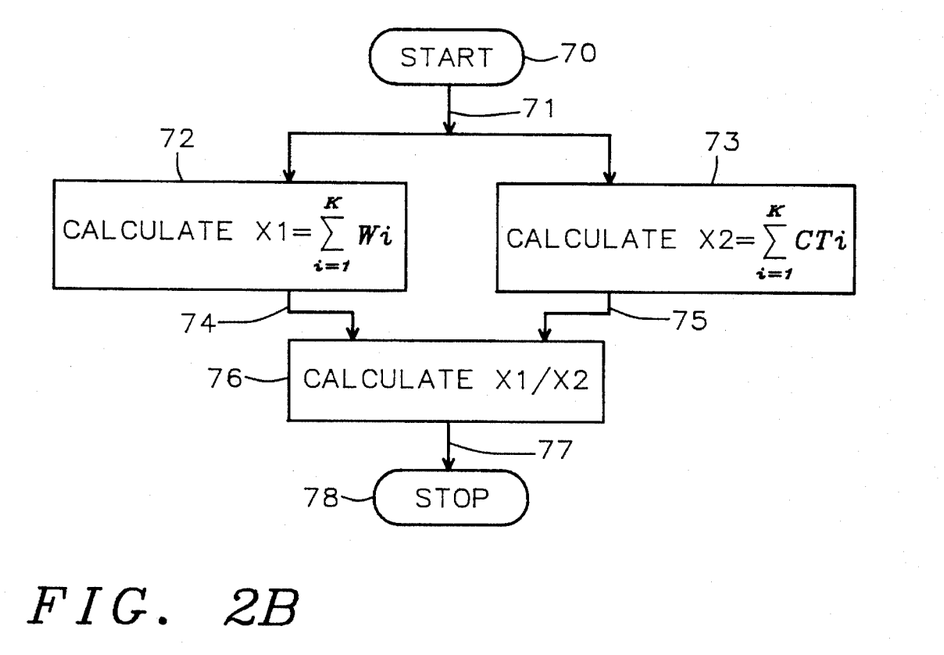
FIG. 2B shows the program for calculating LOADING (K).

FIG. 2B shows the program for calculating LOADING (K). The program begins at step 70 which leads by line 71 to steps 72 and 73. The numerator X1 of the ratio of the summation of work in progress WIP from i to K is calculated in step 72 (where $WIP_i$ is written as "$W_i$" for convenience of illustration. Then X2, the sum of the stage process cycle time is calculated as a denominator in step 73. The outputs of steps 72 and 73 pass on lines 74 and 75 to step 76 where the ratio of X1 to X2 is calculated which is the LOADING(K). The program proceeds on line 77 to stop in step 78.

$$LOADING(K) = \sum_{i=1}^{K} WIP(i) / \sum_{i=1}^{K} CT(i)$$

K: Loading.
CT: stage process cycle time.
WIP: stage work-in-process quantity.

Figure 2C:
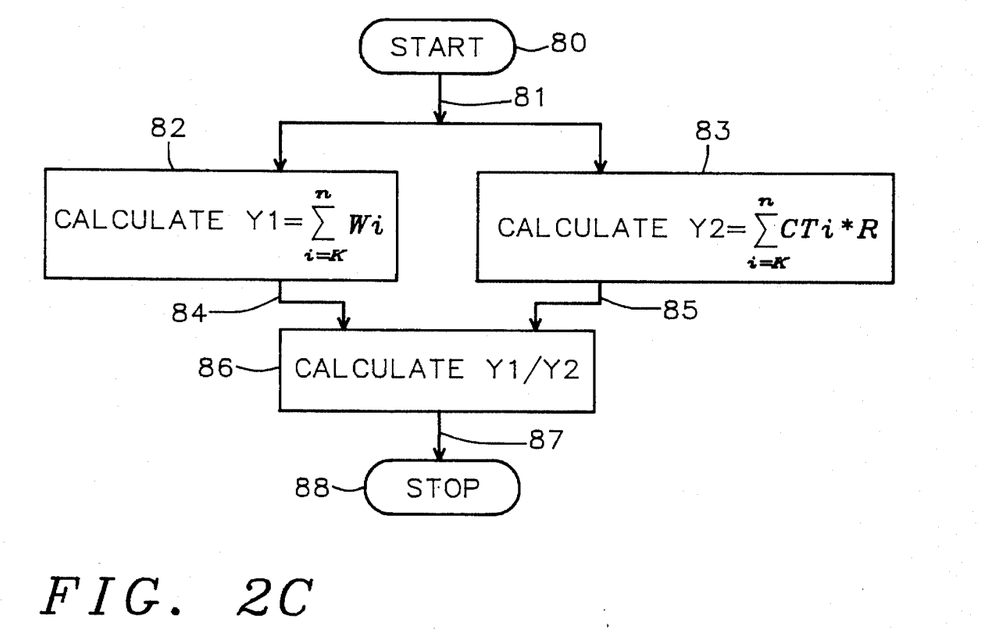
FIG. 2C shows the program for calculating DEMAND (K).

FIG. 2C shows the program for calculating DEMAND (K). The program begins at step 80 which leads by line 81 to steps 82 and 83. The numerator Y1 of the ratio of the summation of work in progress WIP from i to K is calculated in step 82 (where $WIP_i$ is written as "$W_i$" for convenience of illustration). Then Y2, the sum of the stage process cycle time is calculated as a denominator in step 83. The outputs of steps 82 and 83 pass on lines 84 and 85 to step 86 where the ratio of Y1 to Y2 is calculated which is the DEMAND (K).

$$DEMAND(K) = \sum_{i=K}^{n} WIP / \sum_{i=K}^{n} CT_i * R$$

n: total process stages.
CTi: stage process cycle time.
WIP: stage work-in-process quantity.

The loading equation from above is restated here.

$$LOADING(K) = \sum_{i=1}^{K} WIP(i) / \sum_{i=1}^{K} CT(i)$$

LOADING Intensity=LOADING/Equipment Capacity
DEMAND Intensity=DEMAND/Equipment Capacity

3. MINIMA DEMAND TARGET $$MDT(k)=Min\{D(k),C\_WIP(k)\}$$

MDT - - - Minimum DEMAND Target
D - - - DEMAND
C_WIP - - Coming WIP

Coming WIP is defined as all of the WIP that will arrive at a given stage in a one day cycle time. DEMAND is defined above.

Such a "stage" at which the WIP will arrive can be one of many different stages.

4. DYNAMIC DISPATCHING METHOD

Definitions:
1) Hi-WIP - - - High priority WIP
2) Slow-WIP - - WIP queue time over maximum queue time
3) Updated target=Max {Min. demand target, Actual out+Hi-WIP+Slow-WIP}
4) Next machine Capacity Ratio (NEC_R)=Next Equipment Group WIP/Equipment Available Capacity
5) Dynamic Dispatching Ranking (DD_R) =(Updated Target Actual−Actual Out)/NEC_R

CALCULATION OF DYNAMIC DISPATCH RANKING

Updated Target: (UT)

$$UT=MAX (MDT,AO+HP\_WIP+S\_WIP)$$

Next Equipment Capacity Satisfaction Ratio: (NEC_R)

$$NEC\_R = \frac{NEG\_WIP}{EAC}$$

Dynamic dispatching ranking: (DD_R)

Figure 2D:
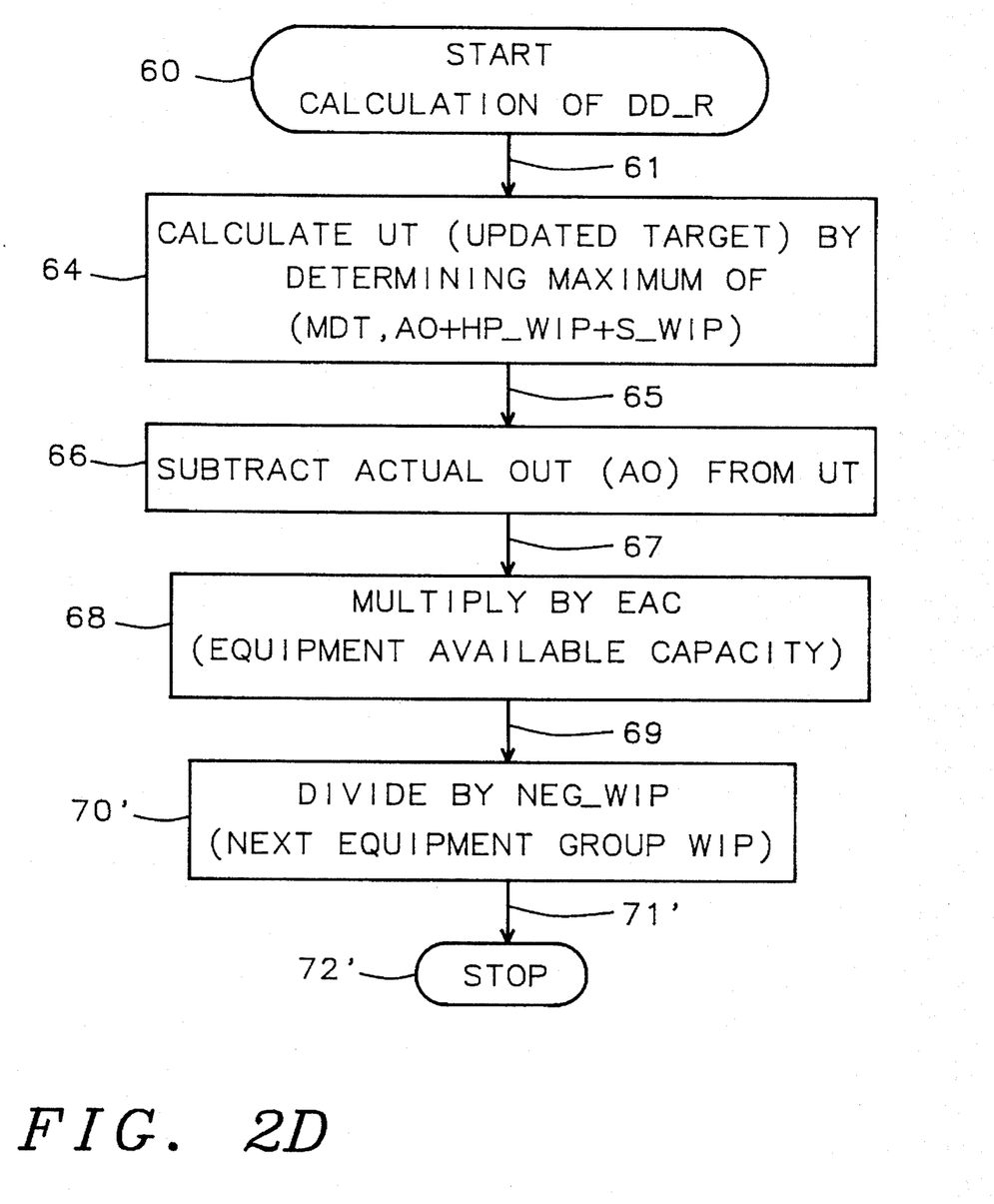
FIG. 2D shows the equations calculated in the calculation of DD_R.

Referring to FIG. 2D, the equations as follows are calculated in the calculation of DD_R as follows:

$$(DD\_R) = \frac{UT - AO}{NEC\_R}$$

$$(DD\_R) = \frac{(MAX (MDT, AO + HP\_WIP + S\_WIP) - AO) * EAC}{NEG\_WIP}$$

where the values are as follows:
AO........ Actual Out
DD_R..... Dynamic Dispatching Ranking
EAC....... Equipment Available Capacity
HP_WIP.... High Priority WIP
MAX....... Maximum
MDT....... Minimum DEMAND Target
NEC_R...... Next Equipment Capacity Satisfaction Ratio
NEG_WIP.... Next_Equipment Group WIP
S_WIP..... Slow WIP
UT........ Updated Target Referring to FIG. 2D, the equations as follows are calculated in the calculation of DD_R by the steps which follow:

Step 60 is the start of calculation of DD_R. Step 60 leads by line 61 to step 64 which provides calculation of UT (Updated Target) by determining the maximum of MDT, AO+HP_WIP+S_WIP. The result of step 64 then goes by line 65 to step 66.

In step 66 the value AO (Actual Out) is subtracted from the UT (Updated Target.) The result of step 66 then goes by line 67 to step 68.

In step 68 the result of step 66 is multiplied by the EAC (Equipment Available Capacity.) The result of step 68 then goes by line 69 to step 70'.

In step 70' the result of step 68 is divided by NEG_WIP Next_Equipment Group WIP. The result of step 70' then goes by line 71' to step 72'.

FIG. 2A shows the method (algorithm) for dispatching by lot in accordance with this invention. The beginning of the process is the start 40 which leads by line 41 into the step 42 of sorting the Work In Process (WIP.)

From step 42, line 43 leads to step 44 where the system selects the WIP units which have a high priority in terms of schedule requirements. Then the WIP is sorted by queue time and the WIP is sorted into different batches of WIP having the same recipe of processing steps. Having the same recipe mean that the process steps and process conditions are the same for all WIP in a given batch.

From step 44, line 45 leads to step 46 where the system does a Dynamic Dispatching_Ranking (DD_R) stage calculation except for the WIP which is of high priority. Note that (DD_R)=(Updated demand−Actual Out/NEC_R)

From step 46, line 47 leads to step 48 where the system selects the high priority stage and high priority WIP is placed into batches by recipe based upon queue time management. Step 48 first selects the high priority stage by computer sorting.

Then step 48 batches the high priority stage by recipe based on queue time management by computer sorting.

From step 48, line 49 leads to decision block 50 where the system determines whether the WIP remains at capacity level.

Based upon the equipment number one can determine the total capacity.

If the test results in NO, then the program stops until the next time the computer 20 calls it into operation again.

If YES, then the system goes on line 51 to step 52.

In step 52, the system recalculates the dynamic dispatching ranking DD_R of the WIP for feedback to step 48.

From step 52, line 53 leads back to step 48 where the same operation is repeated from step 48 to step 50.

Figure 3:
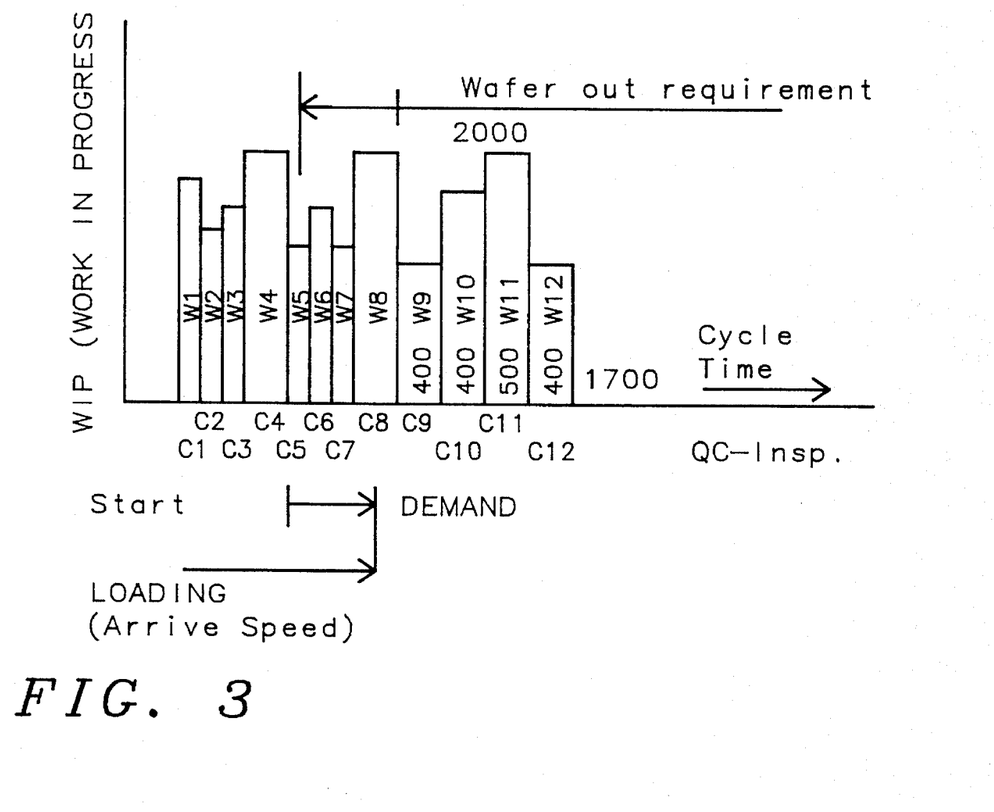
FIG. 3 shows a bar graph of LOADING and DEMAND or WIP (Work in Process) vs. Cycle Time as described above with reference to FIG. 2C.

FIG. 3 shows a bar graph of LOADING and DEMAND or WIP vs. Cycle Time as described above with reference to FIG. 2C.

The LOADING is as follows:

$LOADING_1 = W_1/CT_1$ $LOADING_2 = (W_1+W_2)/(CT_1+CT_2)$

In this case there are factors to be considered as possible:

LOADING Intensity=LOADING/Capacity

DEMAND Intensity=DEMAND/Capacity

Min DEMAND Target=Min(Coming WIP, DEMAND)

$W_1 \ldots W_{12}$ designate WIP.

$C_1 \ldots C_{12}$ designate cycle time.

$$DEMAND = \frac{W\,300}{(C_9 + C_{10} + C_{11} + C_{12}) * R}$$

where:

$$R = \frac{MAX\,[(Remaining\,Cycle\,Time) - (C_9 + C_{10} + C_{11} + C_{12})]}{(C_9 + C_{10} + C_{11} + C_{12})}$$

For example if today is 27 Mar. 1995, then the Remaining Cycle Time=31/Mar −27/Mar=4 days.

Figure 5:
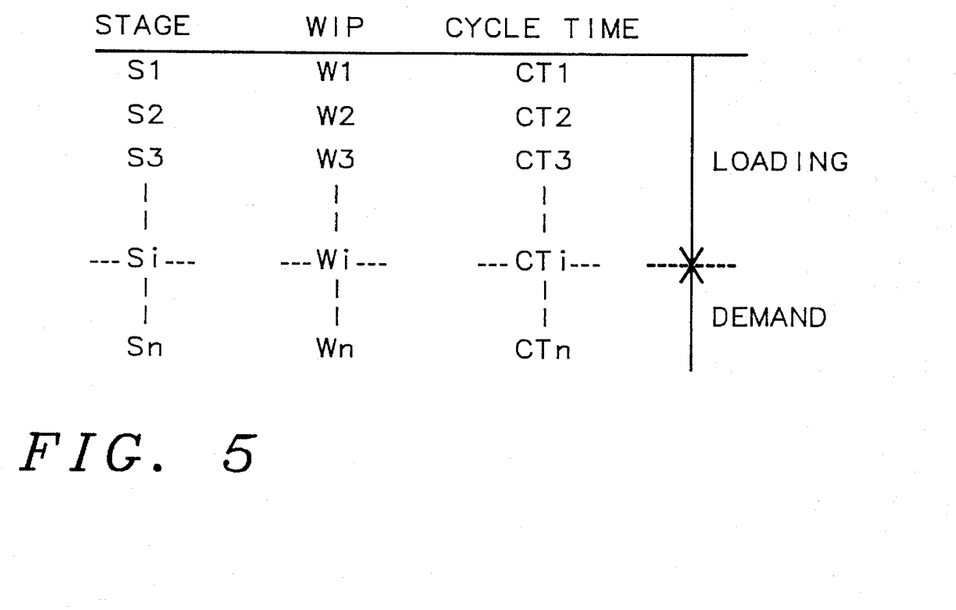
FIG. 5 shows a chart of Stages, WIP and CYCLE Time for stage S1 . . . Sn, WIP for W1 . . . Wn, and Cycle time CT1 . . . CTn in connection with Demand.

FIG. 5 shows chart of Stages, WIP and CYCLE Time for stage S1 . . . Sn, WIP for W1 . . . Wn, and Cycle time CT1 . . . CTn as described in connection with Demand.

1. LOADING intensity is defined to be greater than 1 when the wafer arrival speed exceeds the capacity of the manufacturing system. The solution to the problem of excessive loading intensity is to control release, reduce release quantity or to improve the rate of throughput.

2. DEMAND intensity is defined to be greater than 1 when the demand exceeds the capacity.

3. The loading intensity is greater than the demand intensity when the wafer start quantity exceeds the demand.

4. LOADING intensity is less than demand intensity if wafer starts are insufficient to meet demand.

TABLE A

PHOTO AREA DYNAMIC DISPATCHING REPORT BY STAGE:

| PHO_STG | PHO_WIP | H_PUSH | SLOW | INSP | RUN_IN | PHO_OUT | NNTAR | N_CR | DD_R |
|---|---|---|---|---|---|---|---|---|---|
| CONT-PHO | 293 | 50 | 0 | 7 | 0 | 334 | 504 | 0.20 | 809.6 |
| CODE1-PHO | 96 | 96 | 0 | 0 | 0 | 0 | 96 | 0.23 | 420.4 |
| WELL-PHO | 84 | 84 | 0 | 0 | 0 | 48 | 132 | 0.23 | 367.9 |
| CONT-P-PHO | 48 | 48 | 0 | 0 | 0 | 94 | 142 | 0.16 | 295.1 |
| P-FLD_PHO | 24 | 24 | 24 | 0 | 0 | 216 | 264 | 0.23 | 210.2 |
| POLY-1-PHO | 192 | 72 | 0 | 0 | 24 | 96 | 216 | 0.66 | 175.6 |
| POLY-2-PHO | 642 | 187 | 77 | 108 | 97 | 288 | 552 | 0.55 | 107.9 |
| VT2-PHO | 144 | 72 | 0 | 48 | 48 | 0 | 120 | 0.23 | 105.1 |
| PLDD-PHO | 93 | 21 | 24 | 24 | 0 | 600 | 645 | 0.23 | 92.0 |
| BRC-2-PHO | 168 | 0 | 24 | 24 | 0 | 24 | 72 | 0.55 | 43.9 |
| POLY-3-PHO | 48 | 0 | 0 | 0 | 0 | 48 | 72 | 0.55 | 43.9 |
| VIA-PHO | 166 | 66 | 0 | 56 | 6 | 322 | 389 | 0.20 | 39.7 |
| MET-1-PHO | 589 | 96 | 24 | 23 | 96 | 372 | 492 | 0.35 | 2.9 |
| ONO-PHO | 23 | 0 | 0 | 0 | 0 | 24 | 24 | 0.41 | 0.0 |
| ESD-PHO | 24 | 0 | 0 | 0 | 0 | 324 | 324 | 0.16 | 0.0 |
| PASS-2-PHO | 383 | 105 | 10 | 36 | 117 | 629 | 744 | 1.49 | −25.5 |
| CELL-PHO | 138 | 0 | 0 | 24 | 48 | 120 | 168 | 0.23 | −105.1 |

TABLE A-continued

PHOTO AREA DYNAMIC DISPATCHING REPORT BY STAGE:

| PHO_STG | PHO_WIP | H_PUSH | SLOW | INSP | RUN_IN | PHO_OUT | NNTAR | N_CR | DD_R |
|---|---|---|---|---|---|---|---|---|---|
| SIN-2-PHO | 216 | 0 | 0 | 24 | 72 | 384 | 432 | 0.41 | −116.4 |
| LDD-PHO | 395 | 11 | 0 | 35 | 48 | 144 | 155 | 0.23 | −315.3 |
| MET-2-PHO | 312 | 48 | 0 | 72 | 120 | 312 | 384 | 0.35 | −343.1 |
| N+_S/D_PHO | 407 | 57 | 0 | 48 | 72 | 300 | 347 | 0.16 | −448.8 |

NOTES
H_PUSH = (HIGH PRIORITY PUSH??) - INCLUDES ALL WIP WHICH IS OF PRIORITY 1 AND PRIORITY 2
SLOW = WAITING WIP AND QUEUE TIME OVER 24 HOURS
DD_R = (NEW_TARGET − PHO_OUT − INSP − RUN_IN) * ((CAP + MC_NO)/NWIP)
NEW_TARGET (NTAR) = MAX (TARGET, (PHO_OUT + SLOW WIP + HIGH PRIO WIP))
NEC_R = NEXT MACHINE GROUP WIP/CAPACITY
RUN_IN = RUNNING QUANTITY ON INLINE SYSTEM
NNTAR = UPDATED DEMAND
PHOTOLITHOGRAPHY AREA PROCESS PROCEDURE:
INLINE SYSTEM → INSPECTON → OUT TO OTHER AREA
DETAIL DISPATCHING METHOD BY LOT

Figure 4:
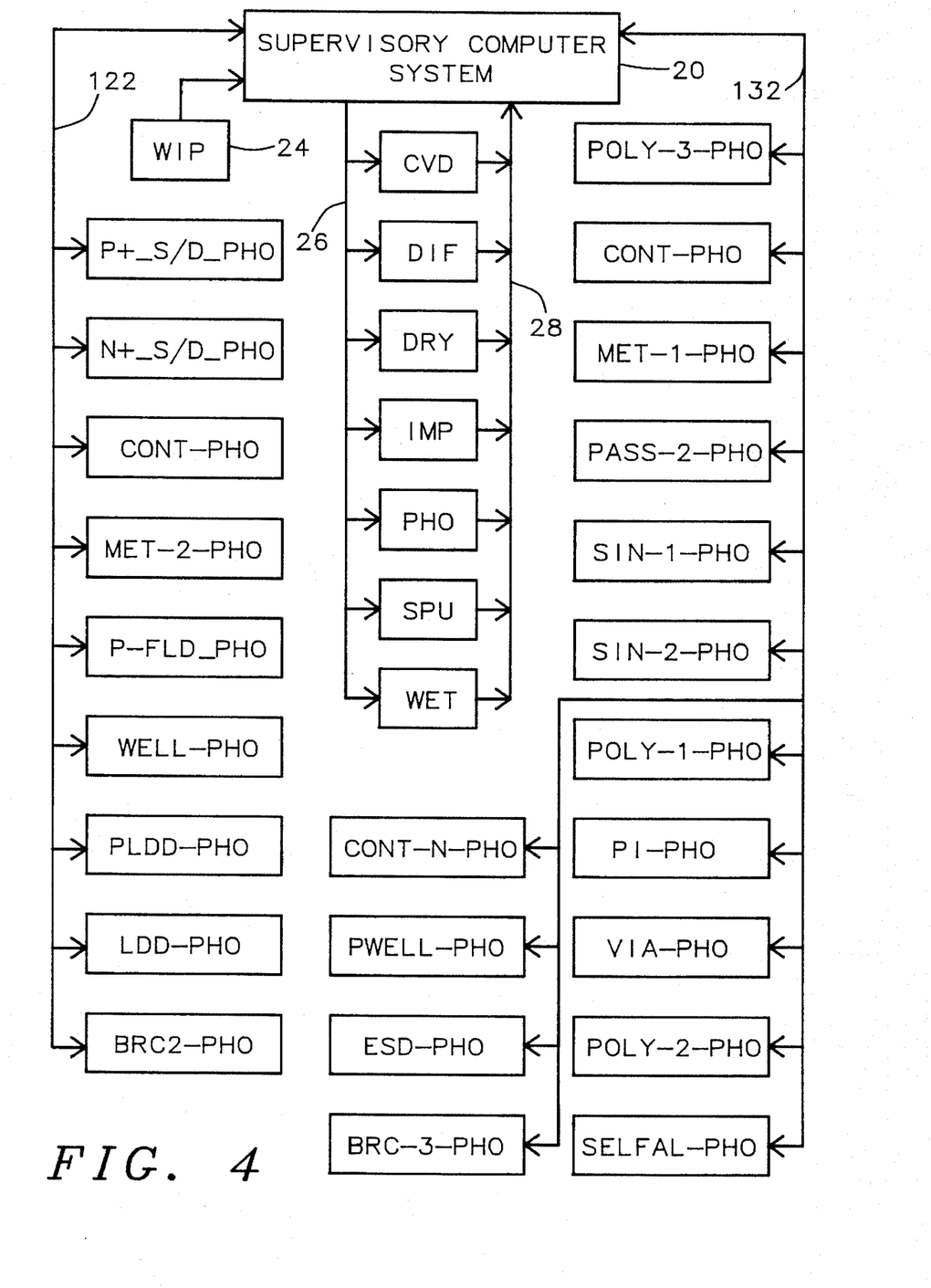
FIG. 4 shows a block diagram similar to FIG. 1 of a portion of a computer controlled integrated circuit manufacturing factory.

FIG. 4 shows a block diagram similar to FIG. 1 of a portion of a computer controlled integrated circuit manufacturing factory. The CPU 20 sends output signals on line 26 to control processing centers including the centers as follows:

CVD, DIF, DRY, IMP, PHO, SPU, and WET.

Those centers provide return signals on line 28 to CPU 20. There are a number of PHO units for photolithography processing of a work piece.

The first group of units are connected by bus line 122 with CPU 20 which are as follows:

PHO_STG . . . Photo Stage
PHO_WIP . . . Photo Work-In_Process
H_PUSH . . . High Priority Pushing WIP
SLOW . . . Slow Moving
INSP . . . Inspection Quantity (Include ADI(After Developing Inspection) and CD Measure)
RUN_IN . . . Running WIP
PHO_OUT . . . PHOTO Stage MOVE OUT Quantity
NNTAR . . . New Target (Updated Target)
N_CR (Defined Above under Dynamic Dispatching Method)
DD_R (Defined Above under Dynamic Dispatching Method)
P+_S/D_PHO
N+_S/D_PHO
CONT-PHO
MET-2-PHO
P-FLD_PHO
WELL-PHO
PLDD-PHO
LDD-PHO
BRC-2-PHO The second group of units are connected by bus line 132 with CPU 20 which are as follows:

POLY-3-PHO
CONT-P-PHO
MET-1-PHO
PASS-2-PHO
SIN-1-PHO
SIN-2-PHO
POLY-1-PHO
PI-PHO
VIA-PHO
POLY-2-PHO
SELFAL-PHO
CONT-N-PHO
PWELL-PHO
ESD-PHO
BRC-3-PHO
PHOTO (Coater+Stepper+Developer→Inspection→CD Measure→

TABLE B

| PHO_STG | PHO_WIP | H_PUSH | SLOW | INSP | RUN_IN | PHO_OUT | UPD_DEM | N_CR | DD_R |
|---|---|---|---|---|---|---|---|---|---|
| P+_S/D_PHO | 636 | 18 | 30 | 0 | 72 | 288 | 674 | 0.13 | 2468.8 |
| N+_S/D_PHO | 454 | 47 | 72 | 0 | 0 | 0 | 96 | 0.13 | 1695.3 |
| CONT-P-PHO | 196 | 4 | 4 | 0 | 0 | 0 | 144 | 0.13 | 1125.0 |
| MET-2-PHO | 873 | 288 | 113 | 97 | 85 | 578 | 979 | 0.23 | 934.6 |
| P-_FLD_PHO | 312 | 0 | 0 | 48 | 48 | 228 | 500 | 0.19 | 916.7 |
| WELL-PHO | 591 | 63 | 84 | 0 | 0 | 0 | 147 | 0.19 | 765.6 |
| PLDD-PHO | 443 | 36 | 22 | 54 | 72 | 240 | 500 | 0.19 | 697.9 |
| LDD-PHO | 343 | 0 | 0 | 0 | 0 | 24 | 144 | 0.19 | 625.0 |
| BRC2-PHO | 396 | 48 | 48 | 0 | 0 | 12 | 240 | 0.40 | 569.3 |
| POLY-3-PHO | 46 | 14 | 2 | 32 | 0 | 69 | 288 | 0.40 | 466.9 |
| CONT-PHO | 729 | 96 | 36 | 0 | 0 | 168 | 500 | 0.71 | 466.0 |
| MET-1-PHO | 450 | 55 | 0 | 26 | 120 | 48 | 300 | 0.23 | 452.3 |
| PASS-2-PHO | 275 | 108 | 72 | 71 | 48 | 113 | 432 | 0.44 | 450.7 |
| SIN-1-PHO | 564 | 84 | 0 | 24 | 72 | 120 | 500 | 0.66 | 430.8 |

TABLE B-continued

| PHO_STG | PHO_WIP | H_PUSH | SLOW | INSP | RUN_IN | PHO_OUT | UPD_DEM | N_CR | DD_R |
|---|---|---|---|---|---|---|---|---|---|
| SIN-2-PHO | 635 | 12 | 0 | 108 | 72 | 72 | 500 | 0.66 | 376.2 |
| POLY-1-PHO | 120 | 24 | 120 | 0 | 0 | 0 | 144 | 0.40 | 359.6 |
| PI-PHO | 192 | 24 | 24 | 0 | 24 | 0 | 48 | 0.13 | 187.5 |
| VIA-PHO | 285 | 58 | 0 | 10 | 0 | 239 | 297 | 0.71 | 67.4 |
| POLY-2-PHO | 627 | 78 | 24 | 54 | 72 | 144 | 288 | 0.40 | 44.9 |
| SELFAL-PHO | 310 | 0 | 72 | 24 | 72 | 48 | 144 | 0.40 | 0.0 |
| CONT-N-PHO | 168 | 0 | 24 | 24 | 0 | 0 | 24 | 0.13 | 0.0 |
| PWELL-PHO | 72 | 24 | 0 | 0 | 24 | 96 | 24 | 0.19 | 0.0 |
| ESD-PHO | 288 | 0 | 24 | 24 | 0 | 24 | 48 | 0.13 | 0.0 |
| BRC-3-PHO | 288 | 0 | 0 | 48 | 0 | 168 | 168 | 0.71 | −67.4 |

NOTES
UPDATED_DEMAND = (UPD_DEMAND)
UPD_DEMAND = MAX (MIN_DEMAND_ TARGET, (PHO_OUT + SLOW WIP + HIGH PRIO WIP))

$$NEC\_R = \frac{\text{NEXT MACHINE GROUP WIP}}{\text{EQUIPMENT AVAILABLE CAPACITY}}$$

$$NEC\_R = \frac{\text{NEXT MACHINE GROUP WIP}}{\text{AVAILABLE EQUIPMENT NUMBER} * \text{EQUIPMENT CAPACITY}}$$

$$DD\_R = \frac{\text{UPDATED DEMAND} - \text{PHO\_OUT} - \text{INSP} - \text{RUN\_IN}}{NEC\_R}$$

Advantages:
1. High priority WIP can be push first.
2. Based on next equipment WIP status and demand, decide stage priority.
3. Queue time management under stage selection.

Disadvantages:
1. High CPU time requirement.
2. High computerization integration needed.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of operating a manufacturing control system with computer control of work flow in automatic control of a manufacturing production line by the steps in the sequence comprising, sorting Work In Process (WIP) by priority and queue time, selecting high priority WIP, in terms of schedule requirements, after sorting of WIP by priority and queue time, after said selecting high priority WIP, sorting WIP by queue time and hatching with other WIP with a same recipe of process steps and process conditions, performing DD_R stage calculation except for high priority batch WIP, where $$DD\_R = UT - \frac{AO}{NEC\_R},$$

where
UT=Updated Target,
AO=Actual Out data, $$NEC\_R = \frac{NEG\_WIP}{EAC},$$

NEG_WIP=Next_Equipment Group WIP, and
EAC=Equipment Availability Capacity, selecting a high priority stage by computer sorting, and then hatching said high priority stage by a said recipe based upon queue time management by computer sorting, a testing step to determine whether the production line remains loaded at capacity, and if the production line is operating below capacity, then since the dispatching system is operating below capacity the said method of operating a manufacturing control system stops, but if the production line remains operating at capacity, then branching to recalculate the DD_R and then returning to the step of selecting the high priority stage and selecting the batch high priority stage by recipe of process steps and process conditions based upon queue time management followed by repeating said testing step and the steps which follow said testing step, whereby automation of production control of a manufacturing process is provided by improved automation of work scheduling.

2. A method of manufacturing in accordance with claim 1 wherein loading is calculated as follows:

$$LOADING(K) = \sum_{i=1}^{K} WIP(i) / \sum_{i=1}^{K} CT(i), \text{ where}$$

K=Loading,
CT=Stage Process Cycle Time, and
WIP(i)=Stage work-in-process quantity.

3. A method of manufacturing in accordance with claim 2 wherein demand is calculated as follows:

$$DEMAND(K) = \sum_{i=1}^{n} WIP(i) / \sum_{i=1}^{n} CT(i) * R, \text{ where}$$

n=total process stages,
K=Loading,
CTi=stage process cycle time, and
WIP(i)=stage work-in-process quantity.

4. A method of manufacturing in accordance with claim 1 wherein (DD_R) is calculated as follows:

$$(DD\_R) = \frac{UT - AO}{NEC\_R}$$

where

UT=updated target,
AO=Actual Out data,
where NEC_R is the Next Equipment Capacity Satisfaction Ratio calculated by the equation as follows:

$$NEC\_R = \frac{NEG\_WIP}{EAC}, \text{ and}$$

NEG_WIP=Next_Equipment Group WIP, and
EAC=Equipment Availability Capacity.

5. A method of manufacturing in accordance with claim 4 wherein loading is calculated as follows:

$$LOADING(K) = \sum_{i=1}^{K} WIP(i) / \sum_{i=1}^{K} CT(i), \text{ where.}$$

K=Loading,
CT=Stage Process Cycle Time, and
WIP(i)=Stage work-in-process quantity.

6. A method of manufacturing in accordance with claim 4 wherein demand is calculated as follows:

$$DEMAND(K) = \sum_{i=1}^{n} WIP(i) / \sum_{i=1}^{n} CT(i) * R, \text{ where}$$

n=total process stages,
K=Loading,
CTi=stage process cycle time, and WIP(i)=stage work-in-process quantity.

7. A method of computer control of work flow in control of a manufacturing production line including the steps in the sequence as follows:

sorting Work In Process (WIP) by priority and queue time,
selecting high priority WIP, in terms of schedule requirements, after sorting of WIP by priority and queue time,
after said selecting high priority WIP, sorting WIP by queue time and batching with other WIP with a same recipe of process steps and process conditions,
performing DD_R stage calculation except for high priority batch WIP, where $$(DD\_R) = \frac{UT - AO}{NEC\_R}, \text{ and}$$

UT=Updated Target,
AO=Actual Out data,
where NEC_R is the Next Equipment Capacity Satisfaction Ratio calculated by the equation as follows:

$$NEC\_R = \frac{NEG\_WIP}{EAC},$$

NEG_WIP=Next_Equipment Group WIP, and
EAC=Equipment Availability Capacity,
selecting a high priority stage by computer sorting,
then bathing said high priority stage by a said recipe based upon queue time management by computer sorting,
testing to determine whether the production line remains loaded at capacity, and
if the production line is operating below capacity, then since the dispatching system is operating below capacity said method of operating a manufacturing control system stops, but if the production line remains operating at capacity,
then branching to recalculate the DD_R and then returning to the step of selecting the high priority stage and selecting the batch high priority stage by recipe of process steps and process conditions based upon queue time management followed by repeating said testing step and the steps which follow said testing step,
whereby automation of production control of a manufacturing process is provided by improved automation of work scheduling.

8. A manufacturing control system including computer control of work flow in automatic control of a manufacturing production line for performing a sequence of steps, means for sorting Work In Process (WIP) by priority and queue time,
means for selecting high priority WIP, in terms of schedule requirements, after sorting of WIP by priority and queue time,
means for sorting WIP by queue time and batthing with other WIP by same recipe of process steps and process conditions,
means for performing DD_R stage calculation except for high priority batch WIP, where $$(DD\_R) = \frac{UT - AO}{NEC\_R}, \text{ and}$$

UT=Updated Target,
AO=Actual Out data,
where NEC_R is the Next Equipment Capacity Satisfaction Ratio calculated by the equation as follows:

$$NEC\_R = \frac{NEG\_WIP}{EAC},$$

NEG_WIP=Next_Equipment Group WIP, and
EAC=Equipment Availability Capacity,
means for selecting a high priority stage by computer sorting and then batching said high priority stage by a said recipe based upon queue time management by computer sorting,
means for testing to determine whether the production line remains loaded at capacity, and if the production line is not operating at capacity, then since the dispatching system is operating below capacity said sequence of steps stops; and
if the production line remains operating at capacity, then means for branching to recalculate the DD_R and then return to said means for selecting the high priority stage and selecting the batch high priority stage by recipe based upon queue time management,
whereby automation of production control of a manufacturing process is provided by improved automation of work scheduling.

9. A manufacturing system in accordance with claim 8 including means for calculating loading as follows:

$$LOADING(K) = \sum_{i=1}^{K} WIP(i) / \sum_{i=1}^{K} CT(i), \text{ where}$$

K=Loading,
CT=Stage Process Cycle Time, and
WIP(i)=Stage work-in-process quantity.

10. A system for manufacturing in accordance with claim 9 including means for calculating demand as follows:

$$\text{DEMAND}(K) = \sum_{i=1}^{n} \text{WIP}(i) / \sum_{i=1}^{n} \text{CT}(i) * R, \text{ where}$$

n=total process stages,

K=Loading,

CTi=stage process cycle time, and

WIP(i)=stage work-in-process quantity.

11. A system for manufacturing in accordance with claim 8 including means for calculating demand as follows:

$$\text{DEMAND}(K) = \sum_{i=1}^{n} \text{WIP}(i) / \sum_{i=1}^{n} \text{CT}(i) * R, \text{ where}$$

n=total process stages,

K=Loading,

CTi=stage process cycle time, and

WIP(i)=stage work-in-process quantity.

\* \* \* \* \*